(12) United States Patent
Sewell et al.

(10) Patent No.: US 8,736,807 B2
(45) Date of Patent: May 27, 2014

(54) SYSTEMS AND METHODS FOR THERMALLY-INDUCED ABERRATION CORRECTION IN IMMERSION LITHOGRAPHY

(75) Inventors: Harry Sewell, Ridgefield, CT (US); Louis John Markoya, Sandy Hook, CT (US); Diane Czop McCafferty, Sandy Hook, CT (US)

(73) Assignee: ASML Holding N.V., Veldhoven (NL)

(*) Notice: Subject to any disclaimer, the term of this patent is extended or adjusted under 35 U.S.C. 154(b) by 278 days.

(21) Appl. No.: 13/176,898

(22) Filed: Jul. 6, 2011

(65) Prior Publication Data

US 2011/0261335 A1 Oct. 27, 2011

Related U.S. Application Data

(63) Continuation of application No. 11/634,924, filed on Dec. 7, 2006, now Pat. No. 7,995,185.

(51) Int. Cl.
*G03B 27/52* (2006.01)

(52) U.S. Cl.
USPC .............................................. 355/30; 355/53

(58) Field of Classification Search
USPC ....................................... 355/30, 53
See application file for complete search history.

(56) References Cited

U.S. PATENT DOCUMENTS

| | | | |
|---|---|---|---|
| 5,705,321 | A | 1/1998 | Brueck et al. |
| 6,563,564 | B2 | 5/2003 | de Mol et al. |
| 7,006,209 | B2 | 2/2006 | Levinson |
| 7,684,014 | B2 | 3/2010 | McCafferty et al. |
| 7,995,185 | B2 | 8/2011 | Sewell et al. |
| 2005/0179877 | A1 | 8/2005 | Mulkens et al. |
| 2006/0082744 | A1 | 4/2006 | Hirukawa |
| 2006/0119816 | A1* | 6/2006 | Baselmans et al. ............. 355/53 |

(Continued)

FOREIGN PATENT DOCUMENTS

| | | |
|---|---|---|
| JP | 2005-012201 A | 1/2005 |
| JP | 2005-136404 A | 5/2005 |

(Continued)

OTHER PUBLICATIONS

English-Language Abstract for Japanese Patent Publication No. 2005-012201 A, published Jan. 13, 2005; 1 page.

(Continued)

*Primary Examiner* — Steven H Whitesell Gordon
*Assistant Examiner* — Mesfin T Asfaw
(74) *Attorney, Agent, or Firm* — Sterne, Kessler, Goldstein & Fox P.L.L.C

(57) ABSTRACT

Immersion lithography aberration control systems and methods that compensate for a heating effect of exposure energy in an immersion fluid across an exposure zone are provided. An aberration control system includes actuators that adjust optical elements within the immersion lithography system and a fluid heating compensation module coupled to the actuators. The fluid heating adjustment module determines actuator commands to make aberration adjustments to optical elements within the immersion lithography system based on changes in one or more of a flow rate of the immersion liquid, an exposure dose and a reticle pattern image. In an embodiment, the aberration control system includes an interferometric sensor that pre-calibrates aberrations based on changes in operating characteristics related to the immersion fluid. Methods are provided that calibrate aberrations, determine actuator adjustments and implement actuator adjustments upon changes in operating characteristics to control aberration effects.

15 Claims, 7 Drawing Sheets

(56) References Cited

U.S. PATENT DOCUMENTS

| | | |
|---|---|---|
| 2006/0197930 A1 | 9/2006 | Kawashima et al. |
| 2007/0258070 A1 | 11/2007 | Fujiwara |
| 2008/0129973 A1 | 6/2008 | McCafferty et al. |
| 2008/0137044 A1 | 6/2008 | Sewell et al. |
| 2009/0109412 A1 | 4/2009 | Sewell et al. |
| 2009/0153813 A1 | 6/2009 | Shiraishi |

FOREIGN PATENT DOCUMENTS

| | | |
|---|---|---|
| JP | 2006-021502 A | 1/2006 |
| JP | 2006/054440 A | 2/2006 |
| JP | 2006-245157 A | 9/2006 |
| WO | WO 2006/080427 A1 | 8/2006 |

OTHER PUBLICATIONS

English-Language Abstract for Japanese Patent Application No. 2005-136404 A, published May 26, 2005; 1 page.

English-Language Abstract for Japanese Patent Publication No. 2006-021502 A, published Jan. 26, 2006; 1 page.

English-Language Abstract for Japanese Patent Publication No. 2006-054440 A, published Feb. 23, 2006; 1 page.

English-Language Abstract for Japanese Patent Publication No. 2006-245157 A, published Sep. 14, 2006; 1 page.

English-Language Translation of Notice of Reasons for Rejection directed to related Japanese Patent Application No. 2007-309574, mailed on Oct. 25, 2010 from the Japanese Patent Office; 5 pages.

Futterer, G. et al., "Interference patterning of gratings with a period of 150nm at a wavelength of 157nm", Optical Microlithography XV, *Proceedings of SPIE*, vol. 4691, pp. 1703-1713 (2000).

Itakura, Y. et al., "Development and evaluation of a $F_2$ laser for immersion interference lithography at 157nm", Optical Microlithography XVIII, *Proceedings of SPIE*, vol. 5754, pp. 1269-1278 (2005).

Non-Final Rejection mailed Mar. 19, 2009 for U.S. Appl. No. 11/634,924, filed Dec. 7, 2006; 6 pages.

Final Rejection mailed Jul. 22, 2009 for U.S. Appl. No. 11/634,924, filed Dec. 7, 2006; 12 pages.

Non-Final Rejection mailed Jan. 8, 2010 for U.S. Appl. No. 11/634,924, filed Dec. 7, 2006; 11 pages.

Final Rejection mailed Jun. 22, 2010 for U.S. Appl. No. 11/634,924, filed Dec. 7, 2006; 12 pages.

Notice of Allowance mailed Apr. 4, 2011 for U.S. Appl. No. 11/634,924, filed Dec. 7, 2006; 11 pages.

\* cited by examiner

SYSTEMS AND METHODS FOR THERMALLY-INDUCED ABERRATION CORRECTION IN IMMERSION LITHOGRAPHY

CROSS REFERENCE TO RELATED APPLICATIONS

This application is a Continuation of U.S. patent application Ser. No. 11/634,924; filed Dec. 7, 2006 (that issued as U.S. Pat. No. 7,995,185 on Aug. 9, 2011), which is incorporated by reference herein in its entirety.

BACKGROUND OF THE INVENTION

1. Field of the Invention

The present invention relates to immersion lithography, more particularly, to providing systems and methods for correcting thermally-induced aberrations due to immersion liquid heating.

2. Related Art

Lithography is a process used to create features on the surface of substrates.

Such substrates can include those used in the manufacture of flat panel displays (e.g., liquid crystal displays), semiconductor wafers, circuit boards, various integrated circuits, print heads, macro/nano-fluidic substrates, and the like. During lithography, a substrate, which is disposed on a substrate stage, is exposed to an image projected onto the surface of the substrate by exposure and projection optical systems located within a lithography apparatus.

The projected image produces changes in the characteristics of a layer, for example, photoresist, deposited on the surface of the substrate. These changes correspond to the features projected onto the substrate during exposure. Subsequent to exposure, the layer can be etched or otherwise processed (e.g., developed in case of the layer being a photoresist layer) to produce a patterned layer. The pattern corresponds to those features projected onto the substrate during exposure. The patterned layer is then used to remove or further process exposed portions of underlying structural layers within or on the substrate, such as conductive, semiconductive, or insulative layers. This process is repeated, together with other steps, until the desired features have been formed on the surface, or in various layers, of the substrate. In the field of immersion lithography the exposure operation is conducted with an immersion liquid, which is typically water, between the last lens element of the projection optics and the substrate. This requires certain design modifications to the apparatus.

Lithographic systems have adjustable optics which allow for the correction of optical wave aberrations of, for example, the projection optics. Adjustments are made for lens heating effects which occur even though the lenses of a projection optics are temperature controlled. The aberration levels are measured and adjusted using both on-system and off-system metering devices such as interferometer based sensors.

Current aberration control systems only deal with slowly changing aberration effects related to lens heating. For example, U.S. Pat. No. 6,563,564, entitled Method of Operating an Optical Imaging System, Lithographic Projection Apparatus, Device Manufacturing method and Device Manufactured Thereby, issued to de Mol et al. on May 13, 2003 relates to lens heating and does not address the heating effect of an immersion fluid. The heating effect on the immersion fluid is instantaneous and dependant upon the delivered dose. As soon as the exposure energy is turned off the heated block of fluid is swept away by the fluid flow through an immersion lithography showerhead. The flowing fluid induces a non-symmetric temperature distribution across the width of the exposure slit which induces aberrations in the image field. The aberrations, such as defocus, change across the width of the field. This kind of instantaneous, non-symmetrical aberration effect is not corrected in current aberration control systems.

What are needed are aberration control systems and methods that effectively address instantaneous, non-symmetrical aberration effects that occur within an immersion lithography system.

SUMMARY OF THE INVENTION

The present invention is directed to immersion lithography aberration control systems and methods that compensate for a heating effect of exposure energy in an immersion fluid across an exposure zone. An aberration control system includes one or more actuators that adjust optical elements for aberrations within the immersion lithography system and a fluid heating compensation module coupled to the actuators. The fluid heating compensating or adjustment module is constructed and arranged to determine actuator commands to make aberration adjustments to optical elements within the immersion lithography system based on changes in at least one of a flow rate of the immersion liquid, an exposure dose and a reticle pattern image. In an embodiment, the aberration control system includes an interferometric sensor constructed and arranged to pre-calibrate aberrations based on changes in operating characteristics related to the immersion fluid.

Methods are provided to calibrate aberrations, determine actuator adjustments and implement actuator adjustments upon changes in operating characteristics to control aberration effects.

Further embodiments, features, and advantages of the present invention, as well as the structure and operation of the various embodiments of the present invention are described in detail below with reference to accompanying drawings.

BRIEF DESCRIPTION OF THE FIGURES

The present invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1:
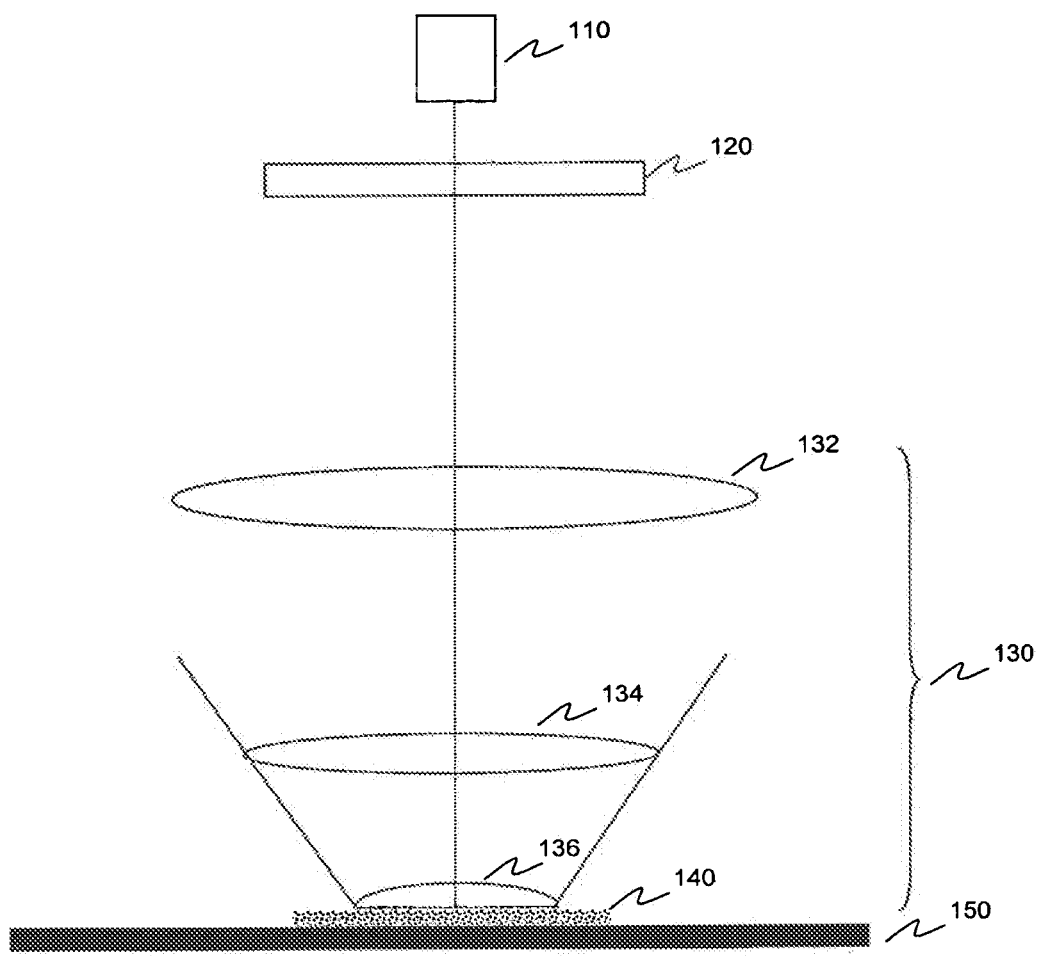
FIG. 1 is a block diagram of an immersion lithography system.

In immersion lithography systems, liquid is injected into the space between a projection optical system ("POS") exit window and the substrate surface. FIG. 1 is a block diagram of immersion lithography system 100. System 100 includes an energy source 110, a pattern generator 120 (such as, for example, a reticle pattern), and a projection optical system 130. The energy source 110 produces exposure doses of energy that are used to pattern a substrate, such as substrate 150 that is being worked. The pattern generator 120 generates the pattern to be produced on substrate 150 (through optical imaging of the reticle pattern). The projection optical system 130 includes an optical element 132, an optical element 134 and an optical element 136 which is also referred to as an exit POS element or a wet lens element. The projection optical system 130 conditions the energy provided by the energy source 110 to properly focus it onto substrate 150 to produce the desired pattern. Conventional projection optical systems may have a wide range of optical elements, both in number and type. The projection optical system 130 provides a simplified example for illustration purposes and is not intended to limit the scope of the invention.

The immersion liquid 140 fills the space between the substrate 150 and the wet lens element 136. An immersion lithography showerhead (not shown) provides for the flow of immersion liquid 140 across the area of the substrate being worked. In a scanning lithography projection apparatus, in order to completely expose the substrate 150, the substrate 150 moves relative to POS 130 and in accordance with a scanning movement of the reticle pattern.

Figure 2:
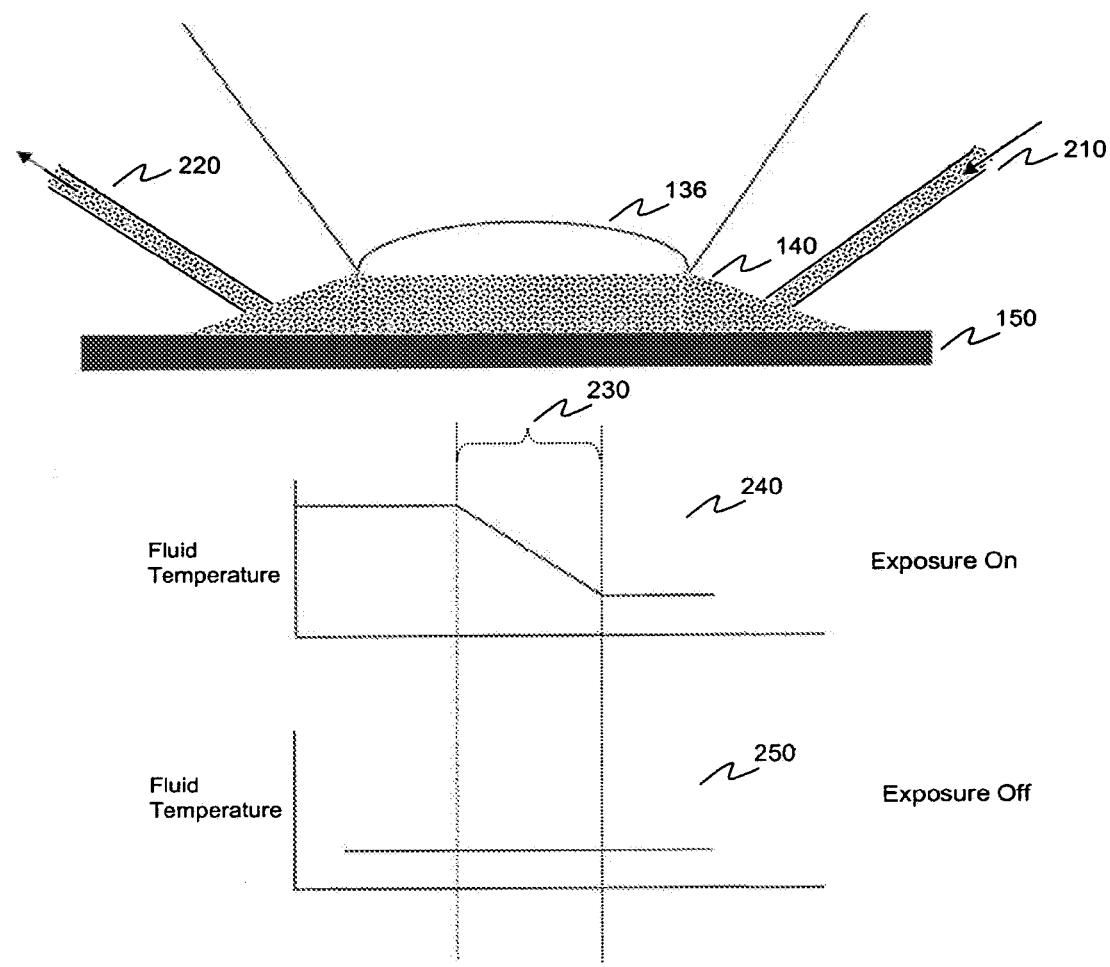
FIG. 2 is a diagram showing the flow of an immersion liquid and the temperature effects.

FIG. 2 is a diagram showing the flow of immersion liquid 140 and the resulting temperature effects induced by the exposure energy of energy source 110. FIG. 2 includes an expanded view of the area around optical element 136. Immersion lithography showerhead inlet 210 drives immersion liquid into exposure zone 230. The exposure zone 230 is the area of the substrate 150 that is currently being patterned and subject to exposure energy. Immersion lithography showerhead outlet 220 removes immersion liquid from exposure zone 230. In a conventional immersion lithography apparatus, the immersion lithography showerhead inlet 210 and outlet 220 may be housed in an immersion lithography showerhead. The flow rate of immersion liquid 140 is carefully controlled as a function of the immersion liquid characteristic(s), for example to ensure that a minimum amount of turbulence is introduced in the liquid to avoid optical impairments.

FIG. 2 provides two plots that show the steady state exposure temperature distribution of immersion liquid 140 within the exposure zone 230. Plot 240 shows the temperature distribution when the energy source 110 is on, and plot 250 shows the temperature distribution when the energy source 110 is off. The inventors have determined that the heating effect on the immersion fluid is instantaneous and dependant upon the delivered dose. As soon as the exposure energy is turned off the heated block of fluid is swept away by the fluid flow through an immersion lithography showerhead. The flowing fluid induces a non-symmetric temperature distribution across the width of the exposure slit which induces aberrations in the image field. The aberrations, such as defocus, change across the width of the field.

The steady state exposure temperature distribution is known to change linearly across the width of exposure slit 230 as shown in FIG. 240. The magnitude of the fluid temperature changes (during exposure) from a nominal value at the upstream edge of exposure slit 230 which is, for simplicity, set at value zero. The magnitude of the temperature increases approximately linearly from the upstream edge of exposure zone 230 to the downstream edge of exposure zone 230. The increase results from immersion fluid 210 gaining heat as it spends time flowing across exposure zone 230. The magnitude of the temperature change on the down stream edge of the exposure slit depends on, for example, the exposure dose, the mask transparency, the fluid flow rate, and the absorption of exposure radiation in the immersion fluid.

A calculation of the heating effect is presented next. As an example, the energy source 110 of immersion lithography system 100 can be assumed to produce ultra-violet radiation. In this case, the power absorbed in the fluid can be determined through the following equations:

$$E_s = S*h*dx \quad (1)$$

where $E_s$ is the energy at substrate 150 (e.g., a wafer), S is the sensitivity of the resist used on the substrate 150, h is size of the exposure zone 230 along a direction perpendicular to the flow-direction and dx is an infinitesimal immersion fluid column width along a direction parallel to the flow-direction, and propagating across exposure zone 230.

The power at the substrate is given by:

$$P_w = S*h*v \quad (2)$$

where $P_w$ is the power at the wafer and v is the flow velocity. The power $P_f$ absorbed in the fluid is then given by:

$$P_f = S*h*v*\{1/(1-T)\} \quad (3)$$

where the transmission of the fluid layer is T. The mass flow rate $M_f$ of the immersion liquid is given by:

$$M_f = \rho*R \quad (4)$$

where $\rho$ is the immersion liquid fluid density and R is the flow rate of the immersion liquid. The temperature change $\Delta T_f$ to the immersion liquid then can be computed using equations (3) and (4) above as:

$$\Delta T_f = Pf/C_p*M_f \quad (5)$$

$$\Delta T_f = S*h*\{(1/(1-T)\}/Cp*\rho*R \quad (6)$$

where $C_p$ is the specific heat of the immersion fluid. As illustrated in FIG. 2, the temperature of immersion fluid 140 rises linearly as it traverses exposure zone 230. The magnitude of the temperature rise can be estimated by using illustrative values for a typical immersion lithography system arrangement. These values are intended to be illustrative, and not to limit the scope of the invention. The exemplary values are as follows:

S=30 mJ/cm$^2$
h=26 mm
v=500 mm/sec
Cp=1.78 KJ/Kg·K
$\rho$=880 Kg/m$^3$
R=5 L/min
T=0.95 where mJ is milliJoules, KJ is KiloJoules, and where $\rho$ is expressed in liters per minute. Substituting these values into equation (6), an exemplary $\Delta T_f$ is calculated to be 1.5 milliK. This represents the maximum temperature rise in the immersion fluid as it is heated while crossing exposure zone 230. The linear rise in temperature produces a change in optical path length as the refractive index of the immersion fluid changes with temperature, which leads to aberrations if not corrected.

The optical path length difference ("OPD") from one side of exposure zone 230 to the other side due to the heating effect of exposing ultra-violet radiation is given by:

$$OPD = n*C_t*TH_f*\Delta T_f \quad (7)$$

where n if the refractive index of the immersion liquid, $C_t$ is the temperature coefficient of the refractive index and $TH_f$ is the thickness of the immersion fluid.

The magnitude of the OPD can be estimated by using illustrative values for a typical immersion liquid. These values are intended to be illustrative, and not to limit the scope of the invention. The exemplary values are as follows:

n=1.65 at a wavelength of 193 nm
$C_t = -550 \times 10^{-6}$
$TH_f = 3$ mm

Substituting these values into equation (7), an exemplary OPD is calculated to be 1.36 nm. With an energy source having a wavelength of 193 nm, the OPD equates to a fraction 0.007 of a wavelength. This represents an estimate of the magnitude of the exposure dose and pattern density sensitive wavefront aberration due to the asymmetric heating of the immersion fluid that assumes a 100% transparent reticle which is to be compensated for in the optics wavefront. The OPD is significantly affected by the transparency of the reticle, the fluid thickness and the transparency of the fluid.

An aberration control system of the present invention uses known or estimated values for these parameters to set up the aberration adjustment of the projection lens system. These adjustments compensate for the aberrations induced by fluid heating during exposure. It is appreciated that between exposures the aberration adjustments may be changed but are not necessarily changed. In an embodiment, aberration adjustments are changed only if the flow rate of fluid is changed or the required dose or reticle pattern image is changed.

Typical aberration adjustments are made to focus tilt (i.e., a substantially linearly varying field dependent best focus position), spherical aberration tilt (i.e., a substantially linearly varying field dependent value of spherical aberration), and to coma aberrations. In an embodiment, a dependence of one or more aberrations on exposure dose and fluid flow rate can be calibrated by measuring the one or more aberrations with an interferometric sensor and observing the effects of dose and fluid flow.

Figure 3:
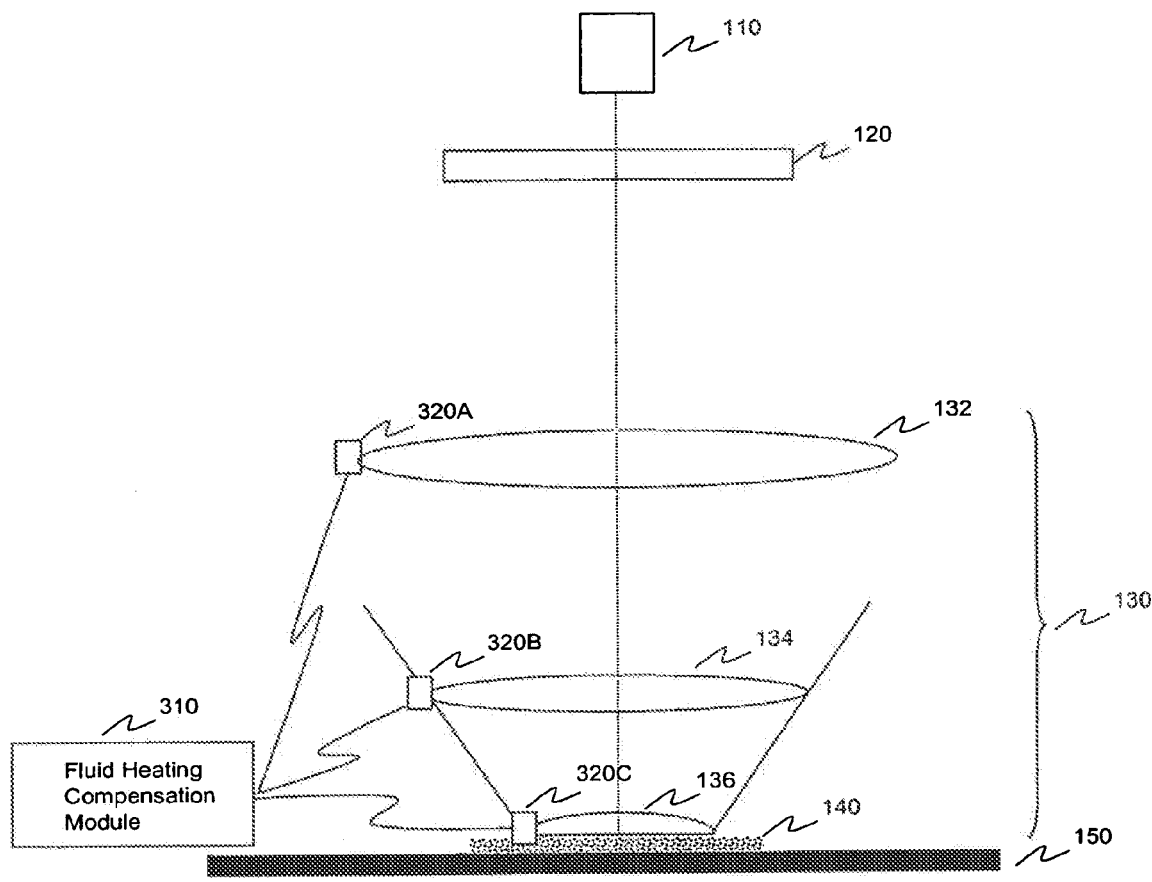
FIG. 3 is a block diagram of an immersion lithography system, according to an embodiment of the present invention.

FIG. 3 is a block diagram of an immersion lithography system 100 that includes an aberration control system, according to an embodiment of the present invention. The aberration control system includes a fluid heating compensation module 310 and lens actuators 320A-C. In embodiments, an aberration control system can also include an interferometric sensor coupled to the fluid heating compensation module. The interferometric sensor can determine light intensity patterns in the exposure zone for various operating characteristics prior to patterning of a substrate. The light intensity patterns may include interference fringes with a shape characteristic for an aberration.

Actuators 320A-C are used to adjust optical elements to correct for aberrations. Specifically, actuator 320A is coupled to optical element 132, actuator 320B is coupled to optical element 134 and actuator 320C is coupled to optical element 136. Actuators 320A-C may be coupled to the fluid heating compensation module 310 either wirelessly or via a wired connection. A single actuator is shown coupled to each optical element for ease of illustration. This is not intended to limit the scope of the invention. Multiple actuators may be coupled to each optical element. Additionally, actuators may not be coupled to all optical elements. For example, in an embodiment one or more actuators may be coupled to optical element 136, as the last optical element, without actuators coupled to any other optical element. The actuators adjust the optical element that they are coupled to based on instructions received from the fluid heating compensation module 310.

The fluid heating compensation module 310 is coupled to actuators 320A-C, and also is coupled to a control system for the immersion lithography system 100 to receive inputs regarding flow rate, exposure on/off cycles, exposure dose, reticle pattern image, and the like. Characteristics regarding the immersion liquid to be used and other operating characteristics may also be directly input into the fluid heating compensation module 310. The fluid heating compensating module 310 determines actuator commands to make adjustments to optical elements within the immersion lithography system 100 based on changes in one or more or all of a flow rate of the immersion liquid, an exposure dose and a reticle pattern image.

Figure 4:
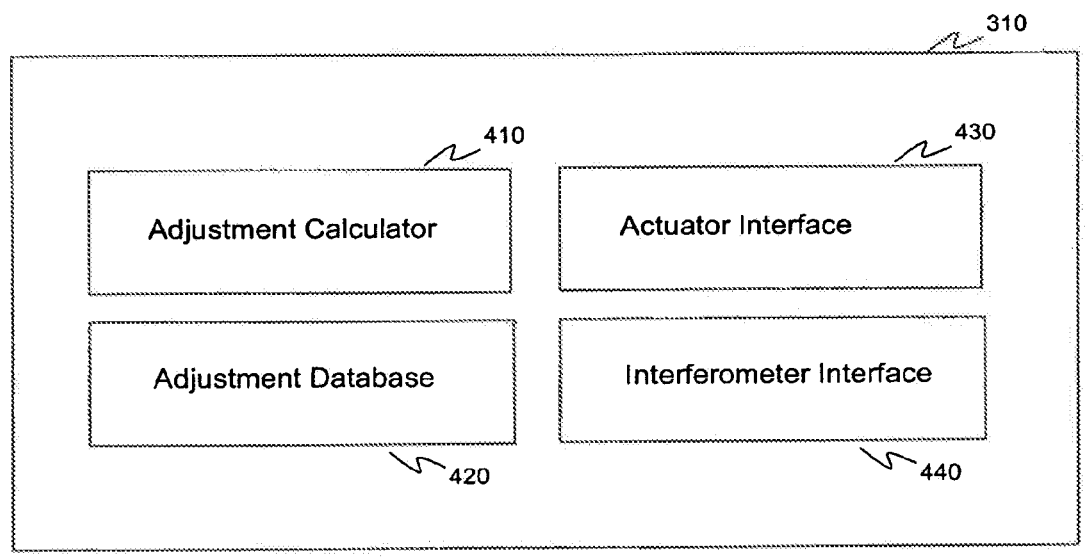
FIG. 4 is a block diagram of a fluid heating compensation module, according to an embodiment of the present invention.

FIG. 4 is a block diagram of a fluid heating compensation module 310 according to an embodiment of the present invention. The fluid heating compensation module 310 includes an adjustment calculator 410, an adjustment database 420, an actuator interface 430 and an interferometer interface 440. In embodiments, the fluid heating compensation module 310 may not include the adjustment database 420 and/or the interferometer interface 440. The adjustment calculator 410 calculates the actuator adjustment settings based on the immersion liquid characteristics, the exposure dose, the flow rate of the immersion liquid and the reticle pattern image. The actuator adjustment settings are then provided to the actuator interface 430 to be transmitted to one or more actuators to make adjustments to the optical elements of the lithographic apparatus optical system.

The adjustment database 420 includes actuator adjustment settings based on estimated effects of the exposure does, the flow rate of the immersion liquid and the reticle pattern image, as well as the characteristics of the immersion liquid. The adjustment database 420 allows actuator settings to be determined through a lookup table, rather than having a need to conduct a calculation.

In an embodiment, the interferometer interface 440 provides an interface to an interferometric sensor. The interferometric sensor can be used to generate a set of sensitivity coefficients representative for aberration effects produced for various operating conditions (e.g., varying flow rate, varying exposure dose), prior to actual processing of a substrate. A set of actuator settings can then be determined for each of the conditions, which can be stored in the adjustment database 420. During actual operation when a set of operating conditions are observed that match a set of operating conditions in the adjustment database 420, the actuator settings associated with the set of operating conditions can be retrieved and provided to the actuators to correct for the aberration(s). Aberration adjustments can include, but are not limited to focus tilt adjustments, spherical aberration tilt adjustments and coma aberration adjustments.

Figure 5:
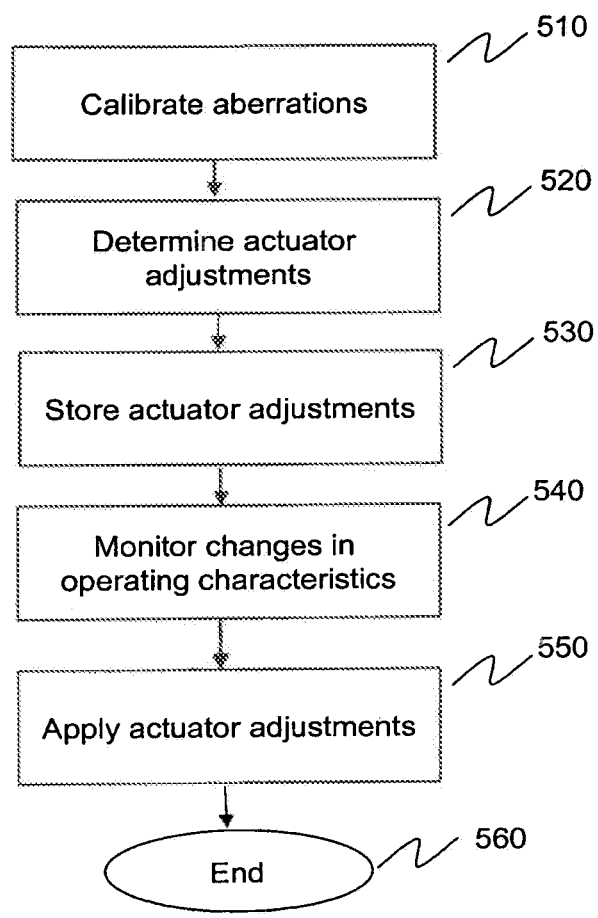
FIG. 5 is a flowchart of a method for compensating for a heating effect of exposure energy in an immersion fluid across an exposure zone of an immersion lithography system using pre-calibrated aberration information, according to an embodiment of the present invention.

FIG. 5 is a flowchart of a method 500 for compensating for a heating effect of exposure energy in an immersion fluid across an exposure zone of an immersion lithography system using pre-calibrated aberration information, according to an embodiment of the present invention. Method 500 begins in step 510. In step 510 aberrations are calibrated based on sets of operating characteristics. For example, flow rate and exposure dose can be varied to generate different aberrations within immersion lithography system 100. An interferometric sensor, coupled to the fluid heating compensation module 310 calibrates aberration effects and provides this information to the fluid heating compensation module 310.

In step 520 actuator adjustment settings are determined. For example, adjustment calculator 410 receives the aberration information from interferometric interface 440. Adjustment calculator 410 then determines actuator adjustments needed to compensate for the aberrations.

In step 530 actuator adjustment settings are stored. For example, actuator adjustment settings are stored in adjustment database 420. The settings are associated with the particular set of operating characteristics (e.g., flow rate and exposure dose).

In step 540 following the initiation of operations of actual substrate processing, changes in operating characteristics are monitored. For example, the fluid heating compensation module 310 monitors changes in the operating characteristics of immersion lithography system 100.

In step 550 when an operating characteristic changes, actuator adjustments that correspond to a changed operating characteristic are applied, such that compensation for the heating effect of exposure energy of an immersion fluid is made. In step 560 method 500 ends.

Figure 6:
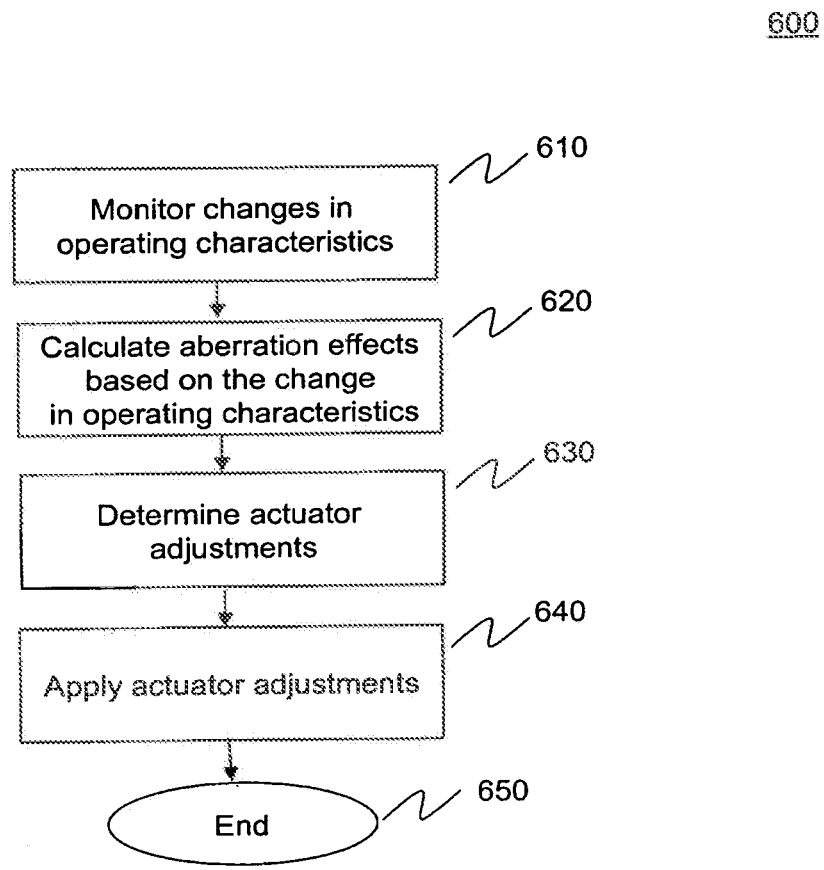
FIG. 6 is a flowchart of a method for compensating for a heating effect of exposure energy in an immersion fluid across an exposure zone of an immersion lithography system using calculated aberration information, according to an embodiment of the present invention.

FIG. 6 is a flowchart of method 600 for compensating for a heating effect of exposure energy in an immersion fluid across an exposure zone of an immersion lithography system using real-time calculated aberration information, according to an embodiment of the present invention. Method 600 begins in step 610.

In step 610 following the initiation of operations of actual substrate processing, changes in operating characteristics are monitored. For example, fluid heating compensation module 310 monitors changes in the operating characteristics of immersion lithography system 100.

In step 620 aberration effects are calculated based on the new operating characteristics. For example, adjustment calculator 410 determines potential aberrations based on the operating characteristics and resident information regarding the immersion liquid characteristics.

In step 630 actuator adjustment settings are determined. For example, adjustment calculator 410 determines actuator adjustments needed to compensate for the aberrations estimated in step 620. In an embodiment, adjustment database 420 can be accessed to retrieve actuator adjustments corresponding to the changed operating characteristics.

In step 640 actuator adjustments are applied, such that compensation for the heating effect of exposure energy of an immersion fluid is made. In step 650 method 600 ends.

Computer System Implementation

Figure 7:
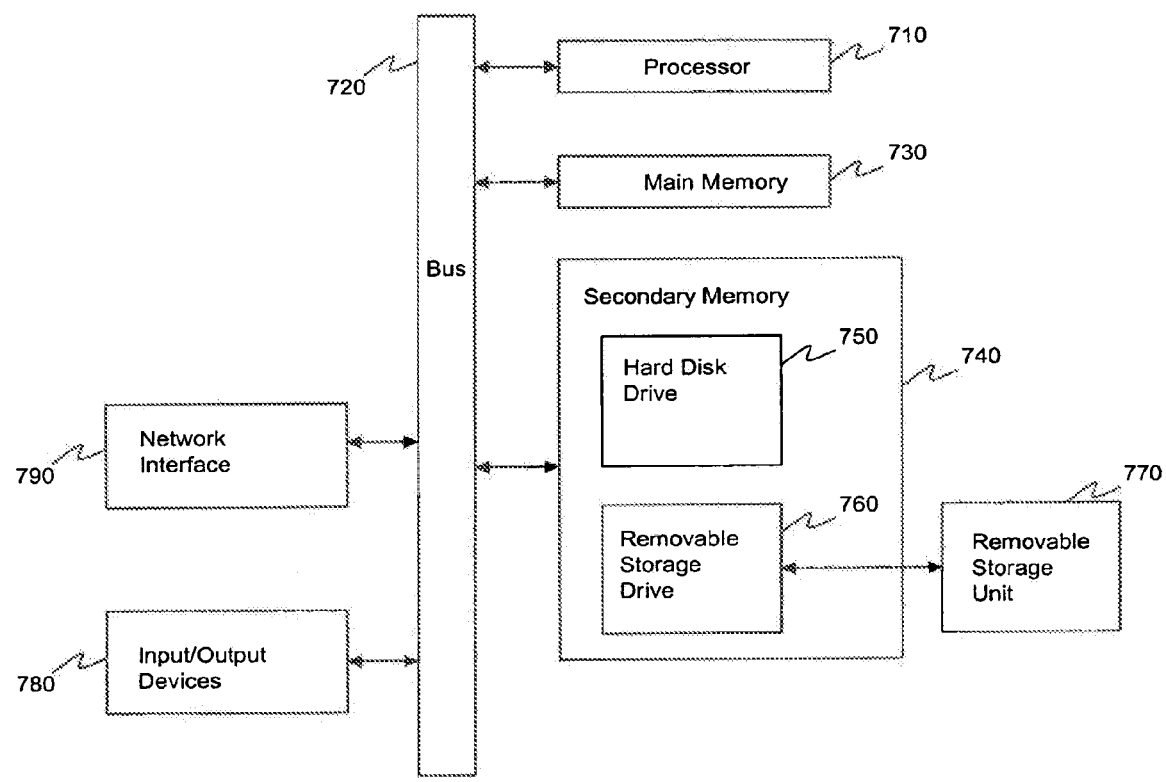
FIG. 7 is a diagram of a computer system implementation, according to an embodiment of the invention.

In an embodiment of the present invention, the methods and systems of the present invention described herein are implemented using computer 700 shown in FIG. 7. In particular, all or portions of the fluid heating compensation module 310 can be implemented using commercially available computers or computing systems.

Computer 700 includes one or more processors (also called central processing units, or CPUs), such as processor 710. Processor 700 is connected to communication bus 720. Computer 700 also includes a main or primary memory 730, preferably random access memory (RAM). Primary memory 730 has stored therein control logic (computer software), and data.

Computer 700 may also include one or more secondary storage devices 740. Secondary storage devices 740 include, for example, hard disk drive 750 and/or removable storage device or drive 760. Removable storage drive 760 represents, for example, a floppy disk drive, a magnetic tape drive, a compact disk drive, an optical storage device, or a tape backup.

Removable storage drive 760 interacts with removable storage unit 770. As will be appreciated, the removable storage unit 760 includes a computer usable or readable storage medium having stored therein computer software (control logic) and/or data.

Removable storage unit 770, also called a program storage device or a computer program product, represents a floppy disk, magnetic tape, compact disk, optical storage disk, or any other computer data storage device. Program storage devices or computer program products also include any device in which computer programs can be stored, such as hard drives, ROM or memory cards, etc.

In an embodiment, the present invention is directed to computer program products or program storage devices having software that enables computer 700, or multiple computer 700s to perform any combination of the functions described herein Computer programs (also called computer control logic) are stored in main memory 730 and/or the secondary storage devices 740. Such computer programs, when executed, direct computer 700 to perform the functions of the present invention as discussed herein. In particular, the computer programs, when executed, enable processor 710 to perform the functions of the present invention. Accordingly, such computer programs represent controllers of the computer 700.

Computer 700 also includes input/output/display devices 780, such as monitors, keyboards, pointing devices, etc.

Computer 700 further includes a communication or network interface 790. Network interface 790 enables computer 700 to communicate with remote devices. For example, network interface 790 allows computer 700 to communicate over communication networks, such as LANs, WANs, the Internet, etc. Network interface 790 may interface with remote sites or networks via wired or wireless connections. Computer 700 receives data and/or computer programs via network interface 790. The electrical/magnetic signals having contained therein data and/or computer programs received or transmitted by the computer 700 via interface 790 also represent computer program product(s).

The invention can work with software, hardware, and operating system implementations other than those described herein. Any software, hardware, and operating system implementations suitable for performing the functions described herein can be used.

Conclusion

While various embodiments of the present invention have been described above, it should be understood that they have been presented by way of example, and not by way of limitation. It will be apparent to persons skilled in the relevant art that various changes in form and detail can be made therein without departing from the spirit and scope of the invention.

What is claimed is:

1. An aberration control system within an immersion lithography system configured to compensate for an aberration due to a heating effect of exposure energy in an immersion fluid across an exposure zone, the aberration control system comprising:

an actuator configured to adjust an optical element within the immersion lithography system based on changes in at least one of:

a flow rate of the immersion fluid,
an exposure dose, and
a reticle pattern image; and
a fluid heating compensation module coupled to the actuator, the fluid heating compensation module being configured to:
calculate an actuator adjustment setting based on an optical path length difference across the exposure zone; and
provide the calculated actuator adjustment setting to the actuator to adjust the optical element to compensate for the aberration due to the heating effect.

2. The aberration control system of claim 1, wherein the fluid heating compensation module comprises an adjustment database that includes a plurality of actuator adjustment settings based on estimated effects of at least one of:
the exposure dose;
the flow rate of the immersion fluid;
the characteristic of the immersion fluid; and
the reticle pattern image.

3. The aberration control system of claim 1, wherein the fluid heating compensation module comprises an adjustment calculator, the adjustment calculator being configured to calculate the actuator adjustment setting based on at least one of:
the exposure dose;
the flow rate of the immersion fluid; and
the reticle pattern image.

4. The aberration control system of claim 1, further comprising an interferometric sensor configured to provide pre-calibration of the aberration based on the exposure dose and the flow rate of the immersion fluid.

5. The aberration control system of claim 1, wherein the fluid heating compensation module comprises an adjustment database that includes actuator adjustment settings based on measured effects of the exposure dose and the flow rate of the immersion fluid.

6. The aberration control system of claim 1, wherein adjustments to compensate for the aberration comprise:
focus tilt adjustments;
spherical aberration tilt adjustments; and
coma aberration adjustments.

7. The aberration control system claim 1, wherein adjustments to compensate for the aberration are made based on a linearly varying temperature change of the immersion fluid across the exposure zone.

8. An immersion lithography system comprising:
an energy source configured to provide an exposure dose;
a projection optics system configured to provide the exposure dose onto an exposure zone of the immersion lithography system;
an immersion lithography system showerhead configured to provide a flow of immersion fluid across the exposure zone of the immersion lithography system; and
an aberration control system configured to compensate for an aberration due to a heating effect of exposure energy in the immersion fluid, the aberration control system comprising:
an actuator configured to to adjust optical elements within the immersion lithography system; and
a fluid heating compensation module coupled to the actuator, the fluid heating compensation module being configured to:
calculate an actuator adjustment setting based on an optical path length difference across the exposure zone; and
provide the calculated actuator adjustment setting to the actuator to adjust the optical element to compensate for the aberration due to the heating effect.

9. A method for compensating for an aberration due to a heating effect of exposure energy in an immersion fluid across an exposure zone of an immersion lithography system comprising an actuator coupled to a projection optical element, the method comprising:
calibrating aberrations based on a set of operating characteristics related to the immersion fluid;
determining actuator adjustments based on an optical path length difference across the exposure zone to compensate for the calibrated aberrations
storing the actuator adjustments associated with the set of operating characteristics;
monitoring changes in an operating characteristic in the set of operating characteristics; and
applying actuator adjustments that correspond to the changed operating characteristic to compensate for the aberration due to the heating effect of exposure energy in an immersion fluid.

10. The method of claim 9, wherein the sets of operating characteristics comprise at least one of:
a flow rate of the immersion fluid
an exposure dose; and
a reticle pattern image.

11. The method of claim 9, further comprising receiving information about a characteristic of the immersion fluid.

12. A method for compensating for an aberration due to a heating effect of exposure energy in an immersion fluid across an exposure zone of an immersion lithography system comprising a series of actuators coupled to projection optical elements, the method comprising:
monitoring changes in operating characteristics related to the immersion fluid; and
applying actuator adjustments that correspond to the changed operating characteristics to compensate for the aberration due to the heating effect of exposure energy of an immersion fluid, the actuator adjustments being calculated based on an optical path length difference across the exposure zone.

13. The method of claim 12, wherein the operating characteristics comprise at least one of:
a flow rate of the immersion fluid;
an exposure dose; and
a reticle pattern image.

14. The method of claim 12, further comprising:
calculating the aberration based on the change in operating characteristics; and
determining the actuator adjustments to compensate for the aberration.

15. The method of claim 12, further comprising:
accessing a database of operating characteristics and corresponding actuator adjustments to compensate for the aberration; and
retrieving the actuator adjustments to compensate for the aberration.

* * * * *